(12) United States Patent
Cheng et al.

(10) Patent No.: US 10,217,955 B2
(45) Date of Patent: Feb. 26, 2019

(54) METHOD FOR MANUFACTURING DISPLAY PANEL, AND DISPLAY DEVICE

(71) Applicants: BOE TECHNOLOGY GROUP CO., LTD., Beijing (CN); Hefei Xinsheng Optoelectronics Technology Co., Ltd., Anhui (CN)

(72) Inventors: Leilei Cheng, Beijing (CN); Jun Bao, Beijing (CN); Dongfang Wang, Beijing (CN); Ce Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/814,690

(22) Filed: Nov. 16, 2017

(65) Prior Publication Data
US 2018/0308914 A1  Oct. 25, 2018

(30) Foreign Application Priority Data
Apr. 24, 2017  (CN) .......................... 2017 1 0273776

(51) Int. Cl.
*H01L 51/52*  (2006.01)
*H01L 27/32*  (2006.01)
(Continued)

(52) U.S. Cl.
CPC ...... *H01L 51/5203* (2013.01); *H01L 21/2807* (2013.01); *H01L 21/28088* (2013.01);
(Continued)

(58) Field of Classification Search
CPC ............ H01L 27/3248; H01L 51/5072; H01L 51/5092; H01L 51/5088; H01L 51/5056;
(Continued)

(56) References Cited

U.S. PATENT DOCUMENTS

2005/0274949 A1* 12/2005 Yamazaki ........... H01L 51/5206
257/59
2013/0330868 A1* 12/2013 Suh ..................... H01L 27/3246
438/34
(Continued)

FOREIGN PATENT DOCUMENTS

CN  104953044 A   9/2015
CN  105499600 A * 4/2016
CN  105869719 A   8/2016

*Primary Examiner* — Selim U Ahmed
*Assistant Examiner* — Evan G Clinton
(74) *Attorney, Agent, or Firm* — Calfee, Halter & Griswold LLP

(57) ABSTRACT

A method for manufacturing a display panel, and a display device are disclosed. The method for manufacturing a display panel includes: providing a TFT substrate; dispersing graphene and metal nanowires in a hydrophilic solvent to form a hydrophilic conductive ink; applying the hydrophilic conductive ink onto the TFT substrate to form a composite electrode layer; forming, on the composite electrode layer, a pixel defining layer having a plurality of openings at least partially exposing the composite electrode layer; applying hydrophilic organic ink into the plurality of openings of the pixel defining layer to form an organic layer; drying the composite electrode layer and the organic layer to form a first electrode and an organic light emitting structure; and forming a second electrode on the organic light emitting structure and the pixel defining layer.

19 Claims, 5 Drawing Sheets

(51) Int. Cl.
    *H01L 51/56*     (2006.01)
    *H01L 51/00*     (2006.01)
    *H01L 21/28*     (2006.01)
    *H01L 23/482*    (2006.01)
    *H01L 29/43*     (2006.01)
    *H01L 29/49*     (2006.01)

(52) U.S. Cl.
    CPC ...... *H01L 23/4828* (2013.01); *H01L 27/3248* (2013.01); *H01L 27/3274* (2013.01); *H01L 29/43* (2013.01); *H01L 29/4966* (2013.01); *H01L 51/0097* (2013.01); *H01L 51/5206* (2013.01); *H01L 51/5221* (2013.01); *H01L 51/56* (2013.01); *H01L 2227/323* (2013.01)

(58) Field of Classification Search
    CPC ............ H01L 51/5012; H01L 51/5203; H01L 51/0097; H01L 51/5221; H01L 51/5206; H01L 27/3274; H01L 51/56; H01L 27/3246; H01L 21/28088; H01L 29/4966; H01L 23/4828
    See application file for complete search history.

(56) References Cited

U.S. PATENT DOCUMENTS

| | | | |
|---|---|---|---|
| 2016/0240589 A1* | 8/2016 | Jeong | H01L 27/322 |
| 2017/0171989 A1* | 6/2017 | Kim | G06F 3/041 |

* cited by examiner

METHOD FOR MANUFACTURING DISPLAY PANEL, AND DISPLAY DEVICE

CROSS-REFERENCE TO RELATED APPLICATIONS

The present application claims priority to Chinese Patent Application No. 201710273776.4, filed on Apr. 24, 2017, the entire contents of which are incorporated herein by reference.

TECHNICAL FIELD

The embodiments of the present disclosure relate to the field of display technology, and more particularly, to a method for manufacturing a display panel, and a display device.

BACKGROUND

An organic light emitting diode (PLED) display device is self-luminous, simple in structure and ultra-thin, with fast response, a wide viewing angle, low power consumption and other characteristics. Therefore, it has become one of the important developing trends of a new generation of display devices and has gained more and more attentions.

The OLED display device emits light through a current-driven luminescent material, typically including an anode layer, an organic layer (or a functional layer), and a cathode layer. The organic layer includes a hole transport layer, a light emitting layer and an electron transport layer. When a voltage is applied across the anode electrode and the cathode electrode, electrons and holes are injected from the cathode electrode and the anode electrode into the electron transport layer and the hole transport layer, respectively, and then transfer to the light emitting layer via the electron transport layer and the hole transport layer. The electrons and holes are recombined in the light emitting layer to realize the self-luminous characteristics of the OLED.

SUMMARY

Embodiments of the present disclosure provide a method for manufacturing a display panel, and a display device.

In one aspect of the present disclosure, there is provided a method for manufacturing a display panel. The method includes: providing a thin film transistor (TFT substrate); dispersing graphene and metal nanowires in a hydrophilic solvent to form a hydrophilic conductive ink; applying the hydrophilic conductive ink onto the TFT substrate to form a composite electrode layer; forming, on the composite electrode layer, a pixel defining layer having a plurality of openings at least partially exposing the composite electrode layer; applying hydrophilic organic ink into the plurality of openings of the pixel defining layer to form an organic layer; drying the composite electrode layer and the organic layer to form a first electrode and the organic light emitting structure; and forming a second electrode on the organic light emitting structure and the pixel defining layer.

In an embodiment of the present disclosure, the dispersing graphene and metal nanowires in a hydrophilic solvent to form a hydrophilic conductive ink includes: forming a composite material from the graphene and metal nanowires; and dispersing the composite material in the hydrophilic solvent.

In an embodiment of the present disclosure, the forming a composite material from the graphene and metal nanowires includes: forming a graphene film on a base; passing a dispersion liquid containing the metal nanowires through a filter to form a metal-nanowire film on the filter; transferring the metal-nanowire film from the filter onto the graphene film to form the composite material; and removing the base.

In an embodiment of the present disclosure, before removing the base, the method further includes: applying the composite material with a pressure of about 0.6 MPa for about 30 minutes.

In an embodiment of the present disclosure, a surface density of the metal nanowires in the composite material is $0.63 \times 10^4$ to $9.3 \times 10^4$ metal nanowires/mm$^2$ graphene.

In an embodiment of the present disclosure, the hydrophilic solvent includes deionized water or ethanol.

In an embodiment of the present disclosure, an upper portion of the pixel defining layer is hydrophobic, and a lower portion of the pixel defining layer is hydrophilic.

In an embodiment of the present disclosure, the conductive ink and/or the organic ink are applied by an ink jet printing method.

In an embodiment of the present disclosure, the method also includes: forming an encapsulation layer on the second electrode.

In an embodiment of the present disclosure, the metal nanowires include one or more of silver nanowires, copper nanowires, gold nanowires, aluminum nanowires, platinum nanowires, and palladium nanowires.

In an embodiment of the present disclosure, the providing a thin film transistor (TFT) substrate includes: forming a gate electrode on a substrate; forming a gate insulating layer on the gate electrode; forming an active layer on the gate insulating layer; and forming a source electrode and a drain electrode on the active layer.

In an embodiment of the present disclosure, providing a thin film transistor (TFT) substrate includes: forming a source electrode and a drain electrode on a substrate; forming an active layer on the source electrode and the drain electrode; forming a gate insulating layer on the active layer; and forming a gate electrode on the gate insulating layer.

In an embodiment of the present disclosure, the active layer includes an organic semiconductor material or a metal oxide semiconductor material.

In an embodiment of the present disclosure, the substrate includes a flexible substrate.

In an embodiment of the present disclosure, one or more of the source electrode, the drain electrode and the gate electrode of a thin film transistor and the second electrode are formed of the conductive ink.

In another aspect of the present disclosure, there is provided a display device, including the display panel formed through the method for manufacturing a display panel described herein.

Further adaptability aspects and scope will be apparent from the description provided herein. It is to be understood that various aspects of the present disclosure may be implemented individually or in combination with one or more other aspects. It is also to be understood that the description and specific embodiments herein are intended to be illustrative only and are not intended to limit the scope of the present disclosure.

BRIEF DESCRIPTION OF THE DRAWINGS

The drawings described herein are for the purpose of illustrating the selected embodiments and are not intended to be exhaustive of all possible embodiments, and are not intended to limit the scope of the present disclosure. In the drawings.

DETAILED DESCRIPTION

Figure 1:
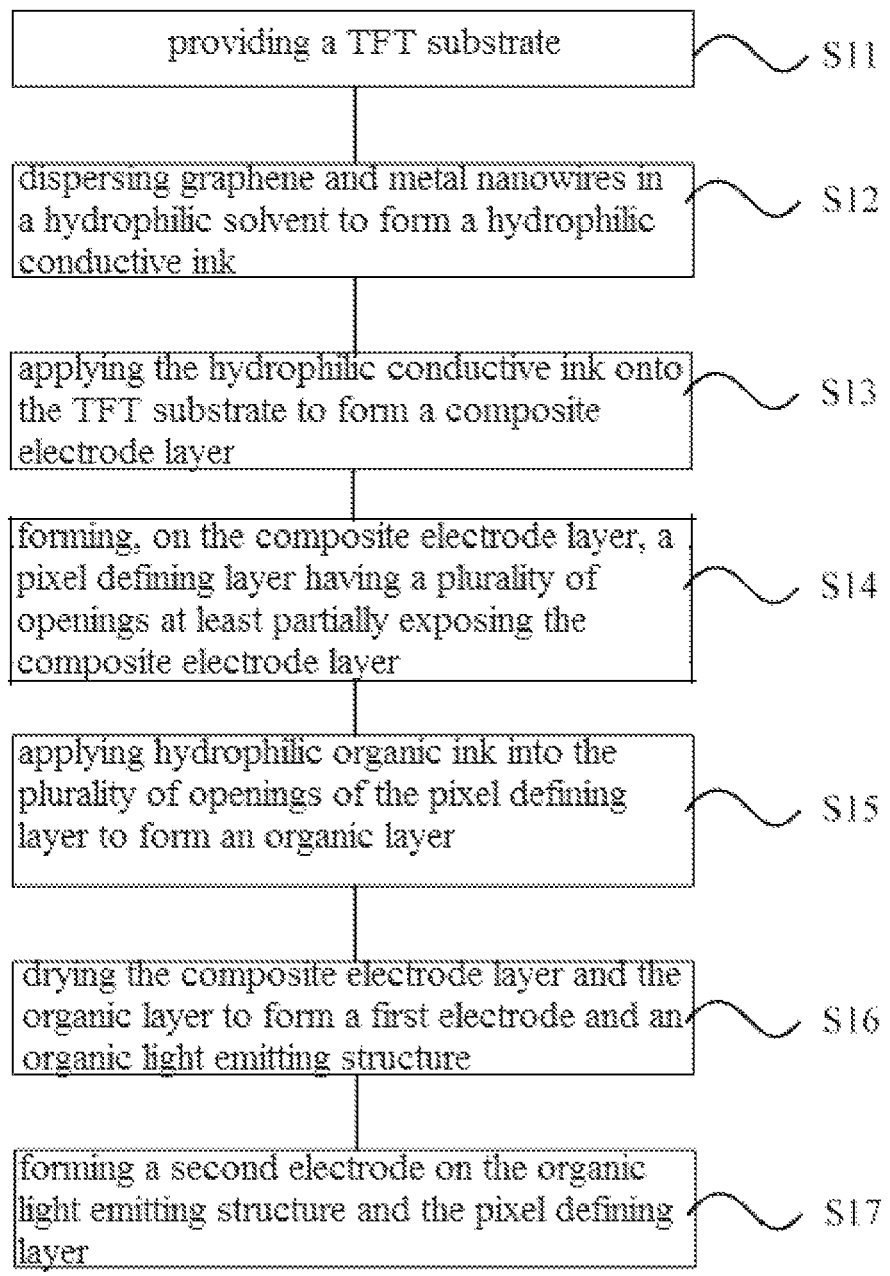
FIG. 1 shows a flow chart of a method for manufacturing a display panel according to an embodiment of the present disclosure.

Various embodiments will now be described in detail with reference to the accompanying drawings, which are provided as exemplary examples of the present disclosure to enable those skilled in the art to practice the present disclosure.

It is to be noted that the following drawings and examples are not intended to limit the scope of the present disclosure. In the case where certain elements of the present disclosure may be partially or fully implemented using known components (or methods or processes), only those portions of such known components (or methods or processes) required to understand the present disclosure will be described, and a detailed description of other portions of such known components will be omitted so as not to obscure the present disclosure. Further, various embodiments include, by way of illustration, existing and future known equivalents of the components referred to herein.

The flowchart depicted in the present disclosure is merely an example. Numerous variants of the flow chart or the steps described therein may be present without departing from the spirit of the present disclosure. For example, the steps may be performed in a different order, or the steps may be added, deleted, or modified. These variants are considered to be part of the claimed aspect.

In the description of the present disclosure, the terms "on", "over", "under", "below", "between" and the like indicate an orientation or position relationship based on the orientation or position relationship shown in the drawings. They are merely for easy description of the present disclosure and for simplification of the description, but not intended to indicate or imply the referred device or element must have the particular orientation, or must be configured or operated in the orientation. Therefore, it is not intended to be construed as limiting the present disclosure. In addition, when an element or layer is referred to as being "on" another element or layer, it may be directly on the another element or layer, or may have an intermediate element or layer. Similarly, when element or layer is referred to as being "under" another element or layer, it may be directly under the another element or layer, or may have at least one intermediate element or layer. When element or layer is referred to as being "between" two element or layers, it may be a unique element or layer between the two elements or two layers, or may have more than one intermediate element or layer.

Unless expressly stated otherwise in the context, the singular forms of the words used herein and in the appended claims include plural forms and vice versa. Thus, when referring to a singular term, the plural form of the corresponding term is usually included. Similarly, the terms "comprising", "including", "containing" and "having" and their grammatical variations are intended to be inclusive and to indicate that there may be additional elements other than the elements listed. Where a term "exemplary" is used, in particular, with a group of terms, the term "exemplary" merely means exemplary and illustrative, and should not be considered exclusive or broad. The terms "first", "second", "third" and the like are for the purpose of description only and are not to be construed as indicating or suggesting relative importance and order of formation.

In OLED display technology, conductive oxides such as ITO (indium tin oxide) are generally used as pixel electrodes. However, on the one hand, such electrode has limited flexibility, expensive cost for resources such as indium, easy diffusion of metal ions, low acid and alkali resistance and other shortcomings. On the other hand, during the process for manufacturing the OLED display device, such electrode would not easily adhere to hydrophilic organic layer in contact with the electrode, potentially causing peeling and misalignment, thereby adversely affecting the performance of the manufactured display device.

According to an embodiment of the present disclosure, there is provided a method for manufacturing a display panel. In this method, a first electrode and an organic light emitting structure are formed of hydrophilic conductive ink and organic ink. This may improve the adhesion strength between the formed first electrode and the organic light emitting structure, and improve the uniformity of the pixels, and thus improve the performance of the display device.

Below, a method for manufacturing a display panel provided in an embodiment of the present disclosure will be described in detail with reference to FIGS. 1 and 2a to 2e. FIG. 1 shows a flow chart of a method for manufacturing a display panel according to an embodiment of the present disclosure. FIGS. 2a-2e show schematic diagrams of the method for manufacturing a display panel as shown in FIG. 1.

As shown in FIG. 1, the method includes steps S11 to S17. In step S11, a thin film transistor (TFT) substrate is provided. In step S12, graphene and metal nanowires are dispersed in a hydrophilic solvent to form a hydrophilic conductive ink. In step S13, the hydrophilic conductive ink is applied onto the TFT substrate to form a composite electrode layer. In step S14, a pixel defining layer having a plurality of openings at least partially exposing the composite electrode layer is formed on the composite electrode layer. In step S15, hydrophilic organic ink for forming an organic light emitting structure is applied into the plurality of openings of the pixel defining layer to form an organic layer. In step S16, the composite electrode layer and the organic layer are dried to form a first electrode and an organic light emitting structure. In step S17, a second electrode is formed on the organic light emitting layer and the pixel defining layer.

Firstly, the above-mentioned problem of the electrode formed by using a conductive oxide may be avoided by using a composite electrode of graphene and metal nanowires. Secondly, since the conductive ink and the organic ink are both hydrophilic, it is possible to improve the adhesion strength between the formed first electrode and the organic light emitting structure. In addition, this also facilitates the spreading of the organic ink on the composite electrode layer, thereby improving the uniformity of the formed organic light emitting structure, and in turn improving the uniformity of the pixels.

In one or more embodiments of the present disclosure, the conductive ink and/or the organic ink may be applied by an ink jet printing method to improve the production efficiency.

Figure 2A:
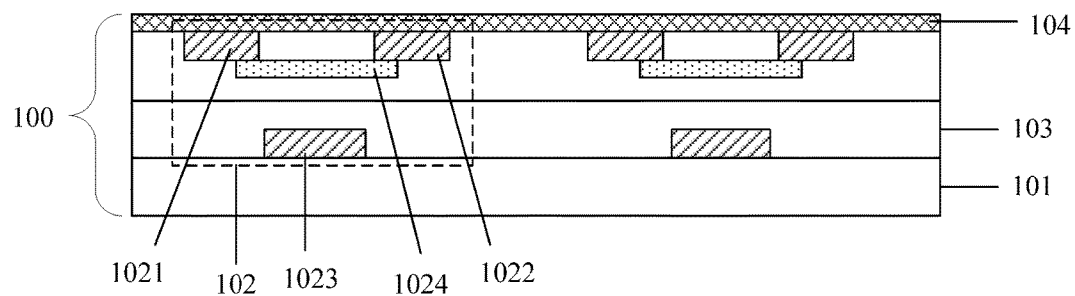
FIGS. 2a-2e show schematic diagrams of the method for manufacturing a display panel as shown in FIG. 1.

In step S11 as shown in FIG. 1, the TFT substrate may be a bottom gate type TFT substrate as shown in FIG. 2a. As shown in FIG. 2a, the TFT substrate 100 may include a substrate 101; a thin film transistor (TFT) 102 having a source electrode 1021, a drain electrode 1022, a gate electrode 1023 and an active layer 1024; and a gate insulating layer 103.

In an embodiment of the present disclosure, the TFT substrate may also include an interlayer insulating layer 104, which may be formed for example, silicon nitride, silicon oxide, or a combination of both.

Figure 3:
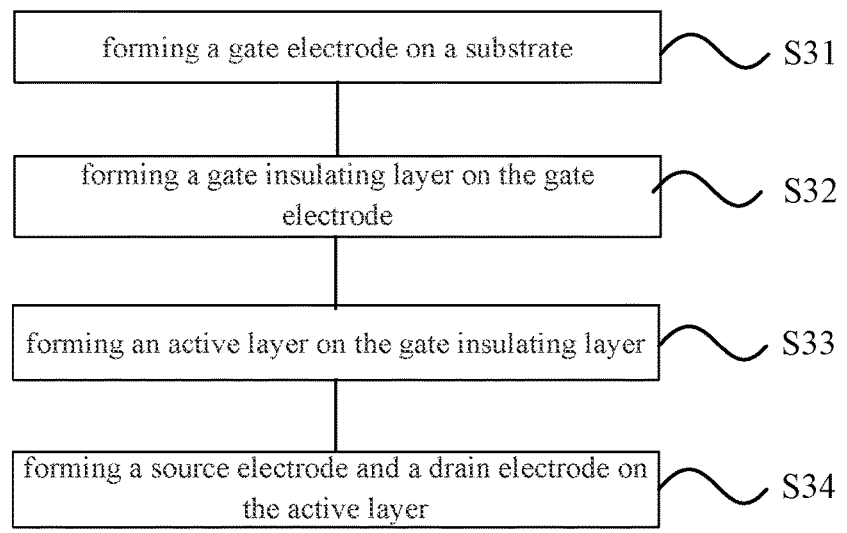
FIG. 3 shows a schematic flow chart of a method for providing a bottom gate type TFT substrate (step S11)

FIG. 3 shows a schematic flow chart of a method for providing a bottom gate type TFT substrate (step S11). As shown in FIG. 3, the method for providing a bottom gate type TFT substrate includes steps S31-S34.

In step S31, the gate electrode 1023 is formed on the substrate 101.

In an embodiment of the present disclosure, the substrate 101 may be a flexible substrate, which may include, for example, polyimide or polyethylene naphthalate. The gate electrode 1023 may be formed of one or more of, for example, molybdenum, titanium, aluminum and copper.

In step S32, the gate insulating layer 103 is formed on the gate electrode 1023.

In an embodiment of the present disclosure, the gate insulating layer may be formed of, for example, silicon nitride, silicon oxide, or a combination of both.

In step S33, the active layer 1024 is formed on the gate insulating layer 103.

In an embodiment of the present disclosure, the active layer 1024 may include an organic semiconductor material or a metal oxide semiconductor material. The organic semiconductor material may include but not limited to one or more of polythiophene (P3HT), polyaniline (PAE), polypyrrole, polyfluorene (PF), pentacene, titanium phthalocyanine and rubrene. The metal oxide semiconductor material may include but not limited to one or more of zinc oxide (ZnO), indium zinc oxide (InZnO), zinc tin oxide (ZnSnO), gallium indium zinc oxide (GaInZnO) and zirconium indium zinc oxide (ZrInZnO).

In step S34, the source electrode 1021 and the drain electrode 1022 are formed on the active layer 1024.

In an embodiment of the present disclosure, the source electrode 1021 and the drain electrode 1022 may be formed of one or more of, for example, molybdenum, titanium, aluminum and copper.

Figure 4:
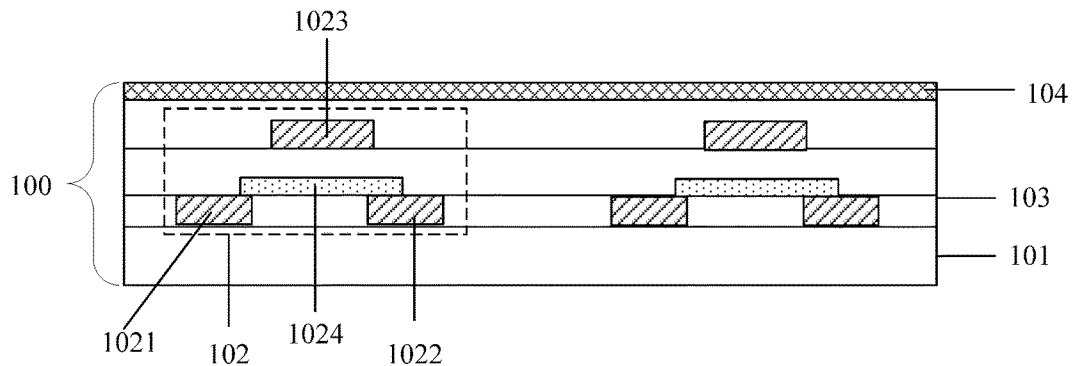
FIG. 4 shows a structure diagram of an exemplary top gate type TFT substrate.
Figure 5:
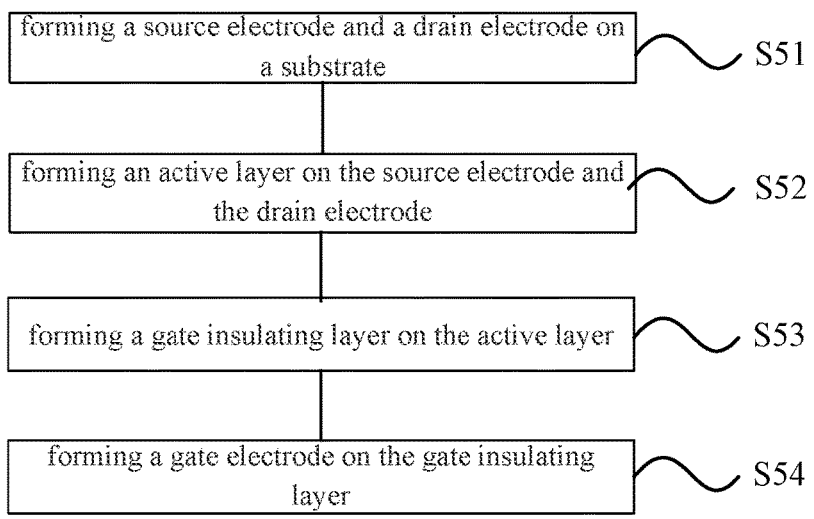
FIG. 5 shows a schematic flow chart of a method for providing a top gate type TFT substrate (step S11)

It is to be understood that, the TFT substrate provided in step S11 as shown in FIG. 1 may be also be a top gate type TFT substrate. FIG. 4 shows a structure diagram of an exemplary top gate type TFT substrate. FIG. 5 shows a schematic flow chart of a method for providing a top gate type TFT substrate (step S11). As shown in FIGS. 4 and 5, the method for providing a top gate type TFT substrate may include steps S51 to S54.

In step S51, a source electrode 1021 and a drain electrode 1022 are formed on a substrate 101.

In step S52, an active layer 1024 is formed on the source electrode 1021 and the drain electrode 1022.

In step S53, a gate insulating layer 103 is formed on the active layer 1024.

In step S54, a gate electrode 1023 is formed on the gate insulating layer 103.

In the following description, manufacturing of a display panel having a bottom gate type TFT substrate will be described as an example. An embodiment of manufacturing a display panel having a top gate type TFT substrate may be implemented by a similar method, the description of which will not be repeated herein.

Figure 6:
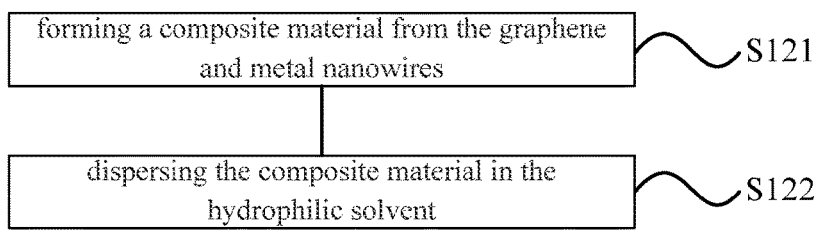
FIG. 6 shows a schematic flow chart of a method for dispersing graphene and metal nanowires in a hydrophilic solvent (step S12)

FIG. 6 shows a schematic flow chart of a method for dispersing graphene and metal nanowires in a hydrophilic solvent (step S12). As shown in FIG. 6, the dispersing graphene and metal nanowires in a hydrophilic solvent (step S12) may include steps S121 to S122. In step S121, a composite material is formed from the graphene and the metal nanowires. In step S122, the composite material is dispersed in a hydrophilic solvent.

In step S121 as shown in FIG. 6, a composite material of graphene and metal nanowires may be manufactured by vacuum filtration along with a transfer printing method. As an example, firstly, a graphene film may be formed on a base by, for example, a chemical vapor deposition (CND). Secondly, a dispersion liquid containing metal nanowires is passed through a filter to form a metal-nanowire film on the filter. Thirdly, the metal-nanowire film is transferred from the filter to the graphene film to form the composite material. Then, the base is removed.

In the present embodiment, before the base is removed, the composite material may be applied with a pressure of about 0.6 MPa, to increase the bond compactness between the graphene and the metal nanowires.

In step S122 described in FIG. 6, the composite material of graphene and metal nanowires may be dispersed into the solvent by means of ultrasound.

Since the composite material formed from graphene and silver nanowires has some bond compactness, it may reduce the edge effect of mere graphene in the ultrasonic dispersion process, and in turn, avoid existence of a large number of grain boundaries, stacks and folds after the formation of grapheme.

It is to be noted that the composite material of the graphene and metal nanowires may also be formed with methods such as a spin coating method, a dropping method, a dip coating method, a spray coating method and other methods.

In an embodiment of the present disclosure, a surface density of the metal nanowires in the composite material formed of graphene and metal nanowires may be $0.63 \times 10^4$ to $9.3 \times 10^4$ metal nanowires/mm$^2$ graphene. The metal nanowires may include, but not limited to, one or more of silver nanowires, copper nanowires, gold nanowires, aluminum nanowires, platinum nanowires, and palladium nanowires. The hydrophilic solvent may include, but not limited to, a deionized water solvent or an ethanol solvent.

In an embodiment of the present disclosure, the graphene and the metal nanowires may be separately dispersed into the solvent to form a hydrophilic conductive ink.

Figure 2B:
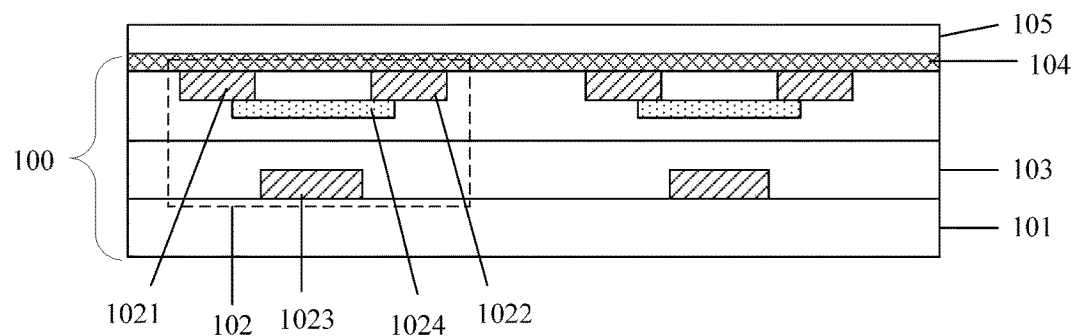

Referring to FIG. 1 again, in step S13, the hydrophilic conductive ink formed of graphene and metal nanowires (or a composite material thereof) may be applied onto the TFT substrate by, for example, an ink jet printing method to form a composite electrode layer 105 (as shown in FIG. 2b). The composite electrode layer 105 may be used as a pixel electrode (anode electrode) of a display panel.

The resistance of a grapheme block is relatively large. Although the resistance of the graphene block may be improved to a certain extent by doping, it still may not meet the practical application requirements. Although the metal nanowires may have a low block resistance meanwhile ensuring a high light transmittance, since there are large pores in the mesh structure of the metal nanowires electrode film and the surface roughness thereof is large, when the metal nanowires electrode film is applied to the device, it tends to cause large leakage current, or even short circuit.

However, in an embodiment of the present disclosure, the disadvantages of the two materials may be overcome by forming the composite electrode from graphene and metal nanowires. On the one hand, the graphene provides a high carrier concentration and an electron mobility level. On the other hand, the metal nanowires provide more electrons and migration channels, so that the formed electrode may have a better light transmission and a smaller block resistance.

Figure 2C:
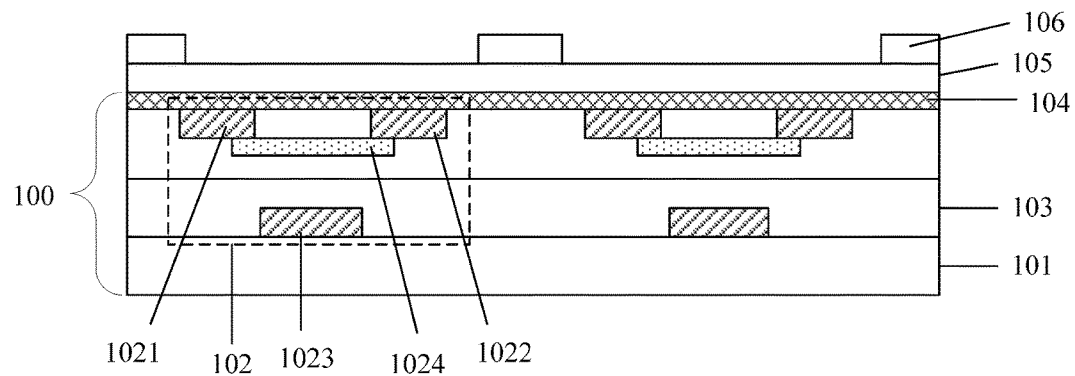

In the step S14 as shown in FIG. 1, a pixel defining layer 106 is formed on the composite electrode layer 105. The pixel defining layer 106 has a plurality of openings at least partially exposing the composite electrode layer 105 (as shown in FIG. 2c) to define a pixel area.

In an embodiment of the present disclosure, an upper portion of the pixel defining layer 106 may be hydrophobic. When the organic ink is applied, this may cause the ink with a micro offset to roll into the opening of the pixel defining layer so as to avoid pixel blending or offset. A lower portion of the pixel defining layer 106 may be hydrophilic. This is advantageous in improving the adhesion strength between the pixel defining layer 106 and the hydrophilic composite electrode layer 105, so as to avoid loosening between the pixel defining layer 106 and the composite electrode layer 105.

Figure 2D:
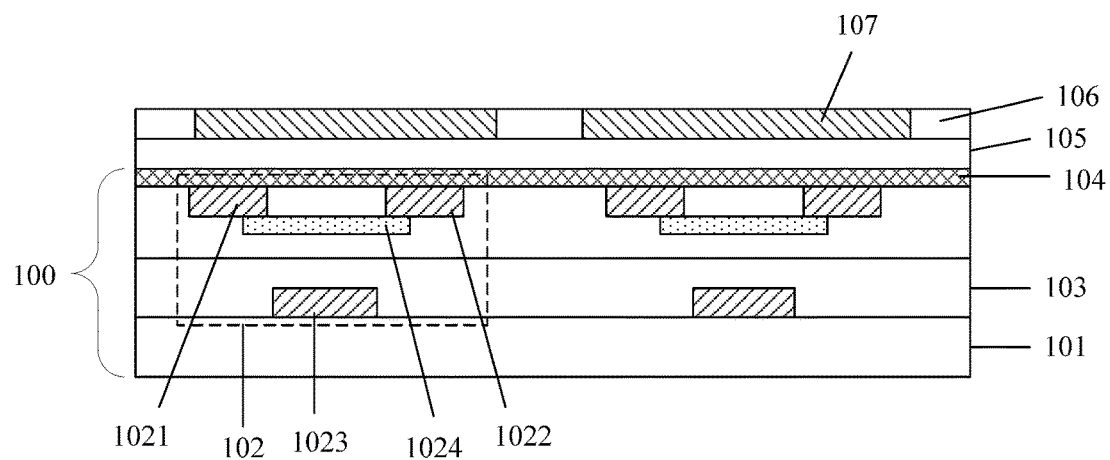

In step S15 as shown in FIG. 1, organic ink is applied by, for example, an ink jet printing method into the plurality of openings of the pixel defining layer 106, to form an organic layer 107 (as shown in FIG. 2d). In an embodiment of the present disclosure, the organic layer 107 may include a hole transport layer, an organic light emitting layer, and an electron transport layer.

In step S16 as shown in FIG. 1, the composite electrode layer 105 and the organic layer 107 are dried to form a first electrode and an organic light emitting structure.

In an embodiment of the present disclosure, since the composite electrode layer 105 and the organic layer 107 are respectively formed of a hydrophilic conductive ink and a hydrophilic organic ink, after the composite electrode layer 105 and the organic layer 107 are dried, the first electrode and the organic light emitting structure may be closely adhered, thereby facilitating the improvement of the performance of the manufactured display panel.

Figure 2E:
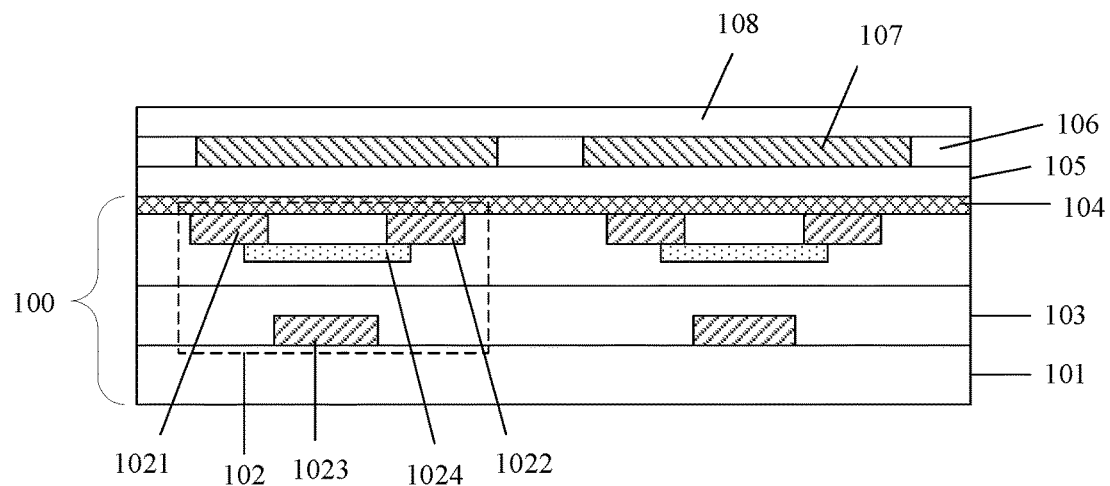

In step S17 as shown in FIG. 1, a second electrode 108 is formed on the organic light emitting structure and the pixel defining layer 106 (as shown in FIG. 2e). The second electrode 108 may serve as a cathode for the display panel. The second electrode 108 may be made of a conductive oxide such as ITO. According to an embodiment of the present disclosure, the second electrode 108 may be similarly formed of the conductive ink containing graphene and metal nanowires.

Figure 7:
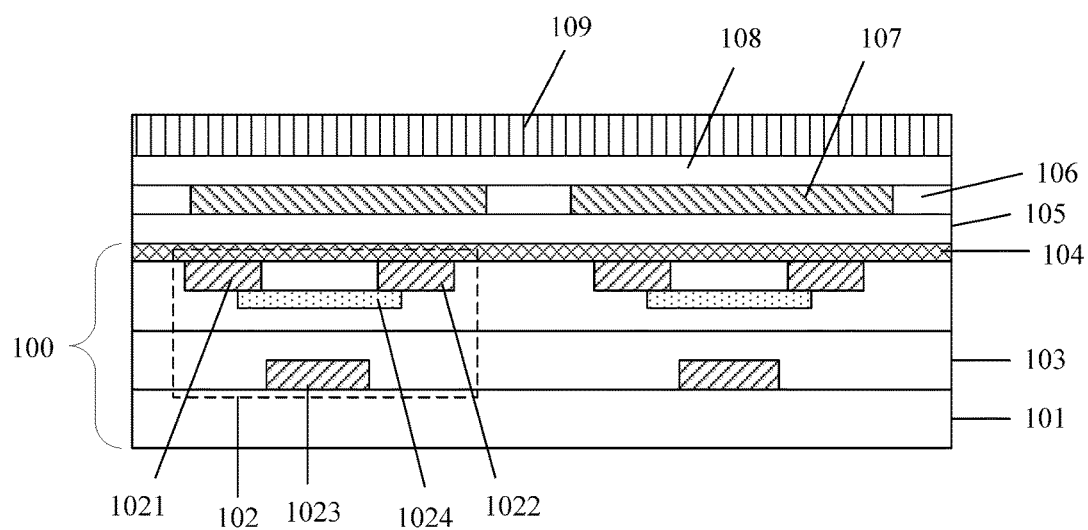
FIG. 7 shows a schematic structure diagram of a display device according to an embodiment of the present disclosure; and Throughout the various views of the drawings, corresponding reference numerals designate corresponding parts or features.

According to an embodiment of the present disclosure, the method for manufacturing a display panel provided by the embodiment of the present disclosure may further include a step of forming an encapsulation layer 109 on the second electrode. FIG. 7 shows a schematic structure diagram of a display panel having the encapsulation layer 109.

It is to be noted that the source electrode, the drain electrode and the gate electrode of the thin film transistor may also be formed of the hydrophilic conductive ink containing graphene and metal nanowires.

In another aspect of the present disclosure, there is provided a display device including the display panel manufactured by the method for manufacturing a display panel described herein. As shown in FIG. 7, the display device includes a TFT substrate 100, a first electrode (anode) 105, a pixel defining layer 106, an organic layer 107, a second electrode (cathode) 108, and an encapsulation layer 109. The TFT substrate 100 may include a substrate 101, a thin film transistor (TFT) 102 having a source electrode 1021, a drain electrode 1022, a gate electrode 1023, and an active layer 1024, a gate insulating layer 103, an interlayer insulating layer 104, and the like. The first electrode 105 is formed on the TFT substrate and includes a composite material formed of graphene and metal nanowires. The pixel defining layer 106 is formed on the first electrode 105 and has a plurality of openings at least partially exposing the first electrode 105. The organic layer 107 is formed in the openings of the pixel defining layer 106. The second electrode 108 is formed on the organic layer 107 and the pixel defining layer 106. The encapsulation layer 109 is formed on the second electrode 108.

In an embodiment of the present disclosure, at least one of the source electrode, the drain electrode and the gate electrode of the thin film transistor and the second electrode may also include the composite material formed of graphene and metal nanowires.

The foregoing description of the embodiments has been provided for the purpose of illustration and description. It is not intended to be exhaustive or to limit the present disclosure. Generally, the various elements or features of a particular embodiment are not limited to the particular embodiment, but where appropriate, these elements and features are interchangeable and may be used in the selected embodiment, even without specific presentation or description. It may also be modified in many ways. Such modifications are not to be regarded as a departure from this disclosure, and all such modifications are intended to be included within the scope of the present disclosure.

What is claimed is:

1. A method for manufacturing a display panel, comprising:
    providing a thin film transistor (TFT) substrate;
    dispersing a composite material formed from graphene and metal nanowires in a hydrophilic solvent to form a hydrophilic conductive ink;
    applying the hydrophilic conductive ink onto the TFT substrate to form a composite electrode layer;
    forming, on the composite electrode layer, a pixel defining layer having a plurality of openings at least partially exposing the composite electrode layer;
    applying hydrophilic organic ink into the plurality of openings of the pixel defining layer to form an organic layer;
    drying the composite electrode layer and the organic layer to form a first electrode and an organic light emitting structure; and
    forming a second electrode on the organic light emitting structure and the pixel defining layer.

2. The method according to claim 1, wherein the step of dispersing a composite material formed from graphene and metal nanowires in a hydrophilic solvent to form a hydrophilic conductive ink comprises:
    forming the composite material from the graphene and the metal nanowires; and dispersing the composite material in the hydrophilic solvent.

3. The method according to claim 2, wherein the step of forming the composite material from the graphene and the metal nanowires comprises:
   forming a graphene film on a base;
   passing a dispersion liquid containing the metal nanowires through a filter to form a metal-nanowire film on the filter;
   transferring the metal-nanowire film from the filter onto the graphene film to form the composite material; and
   removing the base.

4. The method according to claim 3 further comprising, before removing the base:
   applying the composite material with a pressure of about 0.6 MPa for about 30 minutes.

5. The method according to claim 3, wherein a surface density of the metal nanowires in the composite material is $0.63 \times 10^4$ to $9.3 \times 10^4$ metal nanowires/mm$^2$ graphene.

6. The method according to claim 1, wherein the hydrophilic solvent comprises one of deionized water and ethanol.

7. The method according to claim 1, wherein an upper portion of the pixel defining layer is hydrophobic, and a lower portion of the pixel defining layer is hydrophilic.

8. The method according to claim 1, wherein at least one of the conductive ink and the organic ink is applied by an ink jet printing method.

9. The method according to claim 1 further comprising:
   forming an encapsulation layer on the second electrode.

10. The method according to claim 1, wherein the metal nanowires comprise one or more of silver nanowires, copper nanowires, gold nanowires, aluminum nanowires, platinum nanowires, and palladium nanowires.

11. The method according to claim 1, wherein the step of providing a thin film transistor (TFT) substrate comprises:
   forming a gate electrode on a substrate;
   forming a gate insulating layer on the gate electrode;
   forming an active layer on the gate insulating layer; and
   forming a source electrode and a drain electrode on the active layer.

12. The method according to claim 1, wherein the step of providing a thin film transistor (TFT) substrate comprises:
   forming a source electrode and a drain electrode on a substrate;
   forming an active layer on the source electrode and the drain electrode;
   forming a gate insulating layer on the active layer; and
   forming a gate electrode on the gate insulating layer.

13. The method according to claim 11, wherein the active layer comprises one of an organic semiconductor material and a metal oxide semiconductor material.

14. The method according to claim 12, wherein the active layer comprises one of an organic semiconductor material and a metal oxide semiconductor material.

15. The method according to claim 11, wherein the substrate comprises a flexible substrate.

16. The method according to claim 12, wherein the substrate comprises a flexible substrate.

17. The method according to claim 11, wherein one or more of the source electrode, the drain electrode, and the gate electrode of a thin film transistor and the second electrode are formed of the conductive ink.

18. The method according to claim 12, wherein one or more of the source electrode, the drain electrode, and the gate electrode of a thin film transistor and the second electrode are formed of the conductive ink.

19. A display device, comprising the display panel formed through the method according to claim 1.

* * * * *